United States Patent [19]

Suppelsa et al.

[11] Patent Number: 4,990,724
[45] Date of Patent: Feb. 5, 1991

[54] METHOD AND APPARATUS FOR ELECTRICALLY INTERCONNECTING OPPOSITE SIDES OF A FLEX CIRCUIT

[75] Inventors: Anthony B. Suppelsa; Keith D. Soldner, both of Coral Springs, Fla.

[73] Assignee: Motorola, Inc., Schaumburg, Ill.

[21] Appl. No.: 446,229

[22] Filed: Dec. 4, 1989

[51] Int. Cl.⁵ .......................... H05K 1/00; H05K 3/00
[52] U.S. Cl. ..................................... 174/261; 29/853; 29/861; 174/268; 361/398
[58] Field of Search .................. 174/250, 261, 268; 361/398; 29/853, 861, 863

[56] References Cited

U.S. PATENT DOCUMENTS

| | | | |
|---|---|---|---|
| 2,869,040 | 1/1959 | Pifer | 174/261 |
| 3,579,206 | 5/1971 | Grange | 174/261 X |
| 3,601,753 | 8/1971 | Uberbacher | 174/261 X |

Primary Examiner—Morris H. Nimmo
Attorney, Agent, or Firm—Daniel K. Nichols

[57] ABSTRACT

Electrical interconnection of first and second sides of a flex circuit is provided by a tab formed in the flex circuit. At least one circuit trace extends along the tab and provides a contact area on the flex circuit first side. The tab is folded so that the contact area overlays the flex circuit second side. The contact area is then electrically interconnected as by reflow soldering to a contact area on the flex circuit second side.

8 Claims, 2 Drawing Sheets

METHOD AND APPARATUS FOR ELECTRICALLY INTERCONNECTING OPPOSITE SIDES OF A FLEX CIRCUIT

BACKGROUND OF THE INVENTION

This invention relates to a method of providing electrical interconnection between opposed sides of a circuit and particularly for use with a flexible circuit. The current technology for providing electrical interconnection between opposite sides of a flex circuit utilizes metalized throughholes that interconnect electrical circuit runners on the opposite sides of the flex circuit. To produce such metalized throughholes requires a number of process steps such as punching or drilling holes in a pare-etch metal clad flexible substrate, clearing the holes, sensitizing the cleaned hole walls, activating the sensitized walls, using an electroless plating process on the activated sensitized walls, and then electroplating the holes to the desired metal thickness for producing reliable interconnection. It is desirable to provide a means for interconnecting front and backside of a flex circuit without the necessity of producing such metalized throughholes.

SUMMARY OF THE INVENTION

This method of providing electrical interconnection between opposed sides of a flex circuit does not require the use of metalized throughholes. The flex circuit is formed in a manner such that a part of the first side of the flex circuit can be folded to overlay a portion of the second side of the flex circuit to electrically interconnect contact areas of the two sides of the flex circuit.

DESCRIPTION OF THE PREFERRED EMBODIMENT

Figure 1:
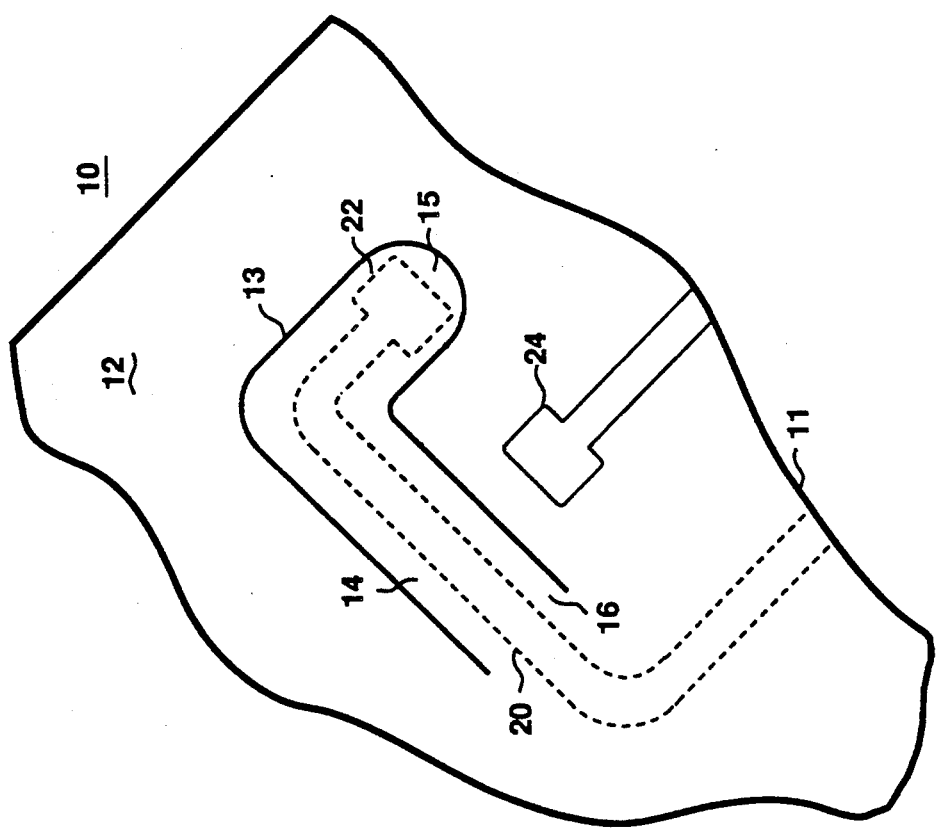
FIG. 1 is a top plan view of a flex circuit having a tab formed in accordance with the present invention.

Referring now by characters of reference to the drawings and first to FIG. 1, it will be understood that the flex circuit indicated generally by 10 has a first or bottom side 11 and a second or top side 12. The first and second sides 11 and 12 can contain any desired metalized patterns for placement and interconnection of electrical components. A tab 13 is formed as by a cutting or stamping operation. The tab 13, as shown in FIG. 1, includes a longitudinal portion 14 and a side portion 15 extending laterally at an end of the longitudinal portion 14. The opposite end 16 of the longitudinal portion 14 remains attached to the flex circuit. At least one electrical circuit trace 20 extends from the flex circuit first side 11 along the tab longitudinal portion 14 to a contact area or solder pad 22 on the side portion 12. The metallization pattern on the flex circuit second side includes at least one pad 24 which is located adjacent to the tab 13.

Figure 2:
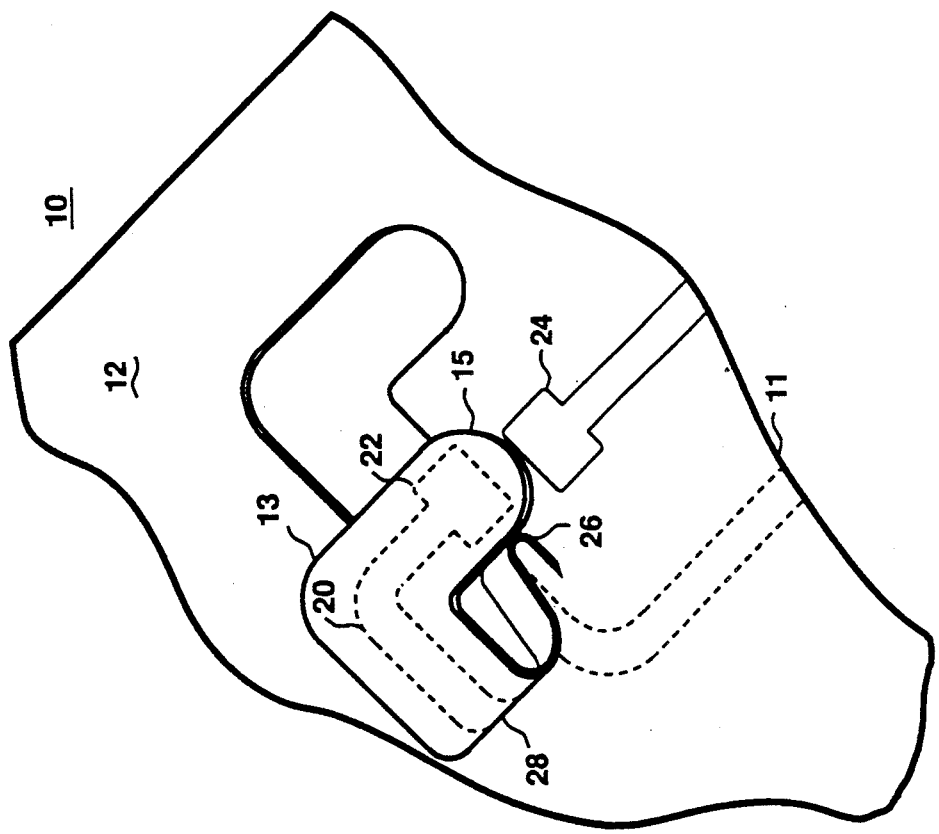
FIG. 2 is a top plan view of the flex circuit of FIG. 1 showing the folded tab.

In order to provide the interconnection of the opposite sides of the flex circuit 10, the tab 13 is folded such as is illustrated in FIG. 2. A double or folded back fanfold arrangement is utilized with folds 26 and 28. The longitudinal portion 14 of the tab 13 is folded back on itself so that its side portion 15 overlays the pad 24 on the second side of the flex circuit. Since the first and second side pads 22 and 24 overlay, they can be electrically interconnected by a reflow solder operation. It will be appreciated that electrical interconnection is provided from the pad 24 on the second side 12 through the first side tab 22, along the circuit trace 20 to the first side of the flex circuit 10.

Figure 3:
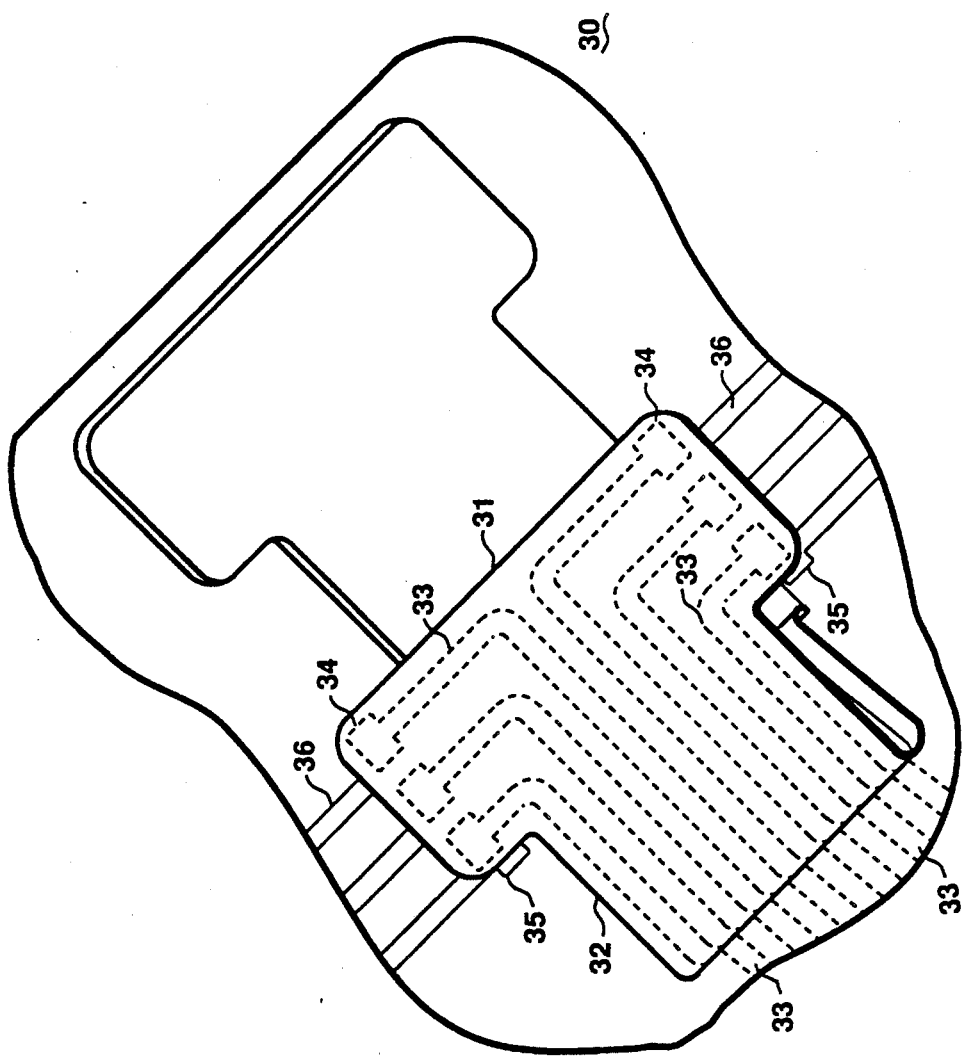
FIG. 3 is a top plan view of another flex circuit in accordance with the present invention.

The embodiment of FIG. 1-2 illustrates a single circuit interconnection, two or more interconnections can be made by providing an appropriate number of runners and pads. FIG. 3 illustrates the interconnection of six circuit traces of a flex circuit 30 having a tab 31. A tab longitudinal portion 32 has six circuit traces 33 extending along the bottom side of flex circuit 30 to six pads 34 on opposed side portions of the tab 31. Six corresponding pads 35 with associated circuit traces 36 are provided on the top side of the flex circuit 30. The flex circuit 30 is fan folded so that the six low side pads 34 overlay the six upper side pads 35 for electrical interconnect, as by a reflow soldering process.

It will be understood that the flex circuits 10 and 30 can include one or more of such tabs for providing electrical interconnections between the opposite sides of the flex circuits. Since the tabs can be formed during the normal cutting or stamping process used when forming the flex circuit an extra process stop is not required to cut the tabs. The tabs are then folded and can be reflow soldered at the same time that other components are being reflowed to the flex circuit in a coventional manner.

We claim as our invention:

1. A method of interconnecting circuit traces on first and second sides of a flex circuit comprising the steps of:
   providing a tab in the flex circuit having at least one circuit trace including a contact area on its first side,
   folding the tab so that the contact area on its first side overlies the flex circuit second side, and
   electrically interconnecting said contact area and a contact area on the flex circuit second side to interconnect circuit traces on said first and second sides of the flex circuit.

2. A method of interconnecting circuit traces as defined in claim 1, in which:
   said step of providing a tab includes providing the tab having a longitudinal portion and a side portion in which the first side contact area is located.

3. A method of interconnecting circuit traces as defined in claim 1 in which said step of folding the tab includes fan folding the tab.

4. A method of interconnecting circuit traces as defined in claim 1 in which said tab includes a plurality of circuit traces each including a contact area, and
   the electrically interconnecting step includes interconnecting the plurality of contact areas with corresponding contact areas on the flex circuit second side.

5. A flexible circuit having electrically interconnected first and second sides comprising:
   a tab formed from the flexible circuit having a circuit trace on its first side,
   the tab being folded so that a portion of said circuit trace overlies and is electrically interconnected to a circuit trace on the second side of the flex circuit.

6. A flexible circuit as defined in claim 5, in which:

said tab includes a longitudinal portion and a side portion, said circuit trace includes a solder pad located on the side portion, and said second side circuit trace includes a solder pad which is soldered to said first side solder pad thereby electrically interconnecting said first and second side circuit traces.

7. A flexible circuit as defined in claim 6, in which:
said tab includes a plurality of circuit traces on its first side, each solder trace including a solder pad located on said side portion, and said second side includes a plurality of circuit traces each including a solder pad soldered to a first side solder pad.

8. A flexible circuit as defined in claim 5, in which:
said tab includes a longitudinal portion and two opposed side portions and a plurality circuit traces each having a solder pad, the solder pads being disposed on the two side portions, and said second side includes a plurality of circuit traces each including a solder pad soldered to a first side solder pad.

* * * * *